US012666544B2

(12) United States Patent
Bauer et al.

(10) Patent No.: US 12,666,544 B2
(45) Date of Patent: Jun. 23, 2026

(54) TEMPORARY PANEL RAILS

(71) Applicant: Rockwell Collins, Inc., Cedar Rapids, IA (US)

(72) Inventors: John A. Bauer, Marion, IA (US); Jenna Averhoff, Cedar Rapids, IA (US); David A. Rafson, Cedar Rapids, IA (US); Brian C. Stevens, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 171 days.

(21) Appl. No.: 18/440,418

(22) Filed: Feb. 13, 2024

(65) Prior Publication Data

US 2025/0261315 A1 Aug. 14, 2025

(51) Int. Cl.
| | |
|---|---|
| *H05K 3/36* | (2006.01) |
| *H05K 3/00* | (2006.01) |
| *H05K 3/325* | (2026.01) |
| *H05K 13/04* | (2006.01) |

(52) U.S. Cl.
CPC ........... H05K 3/368 (2013.01); H05K 3/0097 (2013.01); H05K 3/326 (2013.01); H05K 13/0417 (2013.01); *H05K 2203/302* (2013.01)

(58) Field of Classification Search
CPC .... H05K 3/326; H05K 13/0069; H05K 3/369; H05K 3/36

USPC ......................................................... 361/784
See application file for complete search history.

(56) References Cited

U.S. PATENT DOCUMENTS

| | | | |
|---|---|---|---|
| 5,866,852 | A | 2/1999 | Benz et al. |
| 6,164,634 | A | 12/2000 | Farlow |
| 10,201,093 | B2 | 2/2019 | Szabo et al. |
| 11,277,906 | B2 | 3/2022 | Leermakers et al. |
| 2011/0315433 | A1 | 12/2011 | Thumser |
| 2015/0301525 | A1 | 10/2015 | Hirschman et al. |

FOREIGN PATENT DOCUMENTS

| | | |
|---|---|---|
| CN | 107567182 B | 4/2020 |
| TW | 511413 B | 11/2002 |
| WO | 2023069779 A1 | 4/2023 |

OTHER PUBLICATIONS

European Search Report received in EP Application No. 25157372.1, Jun. 26, 2025, 12 pages.

*Primary Examiner* — Tremesha W Burns
(74) *Attorney, Agent, or Firm* — Suiter Swantz IP

(57) ABSTRACT

A system is disclosed. The system includes a panel comprising a printed circuit board (PCB) and a first panel side comprising a first interlock length configured to interlock with a first rail element. The first interlock length includes a projection that interlocks within a corresponding recess of the first rail element, wherein the first interlock length is configured to interlock with the first rail element and be removed from the first rail element without damaging the PCB or the projection. The system may further include the first rail element.

11 Claims, 16 Drawing Sheets

600

610 — ALIGNING AT LEAST TWO PROJECTIONS OF A FIRST INTERLOCK LENGTH OF A FIRST PANEL SIDE OF A PANEL WITH CORRESPONDING RECESSES LOCATED ON A FIRST RAIL ELEMENT

620 — PRESSING AT LEAST TWO PROJECTIONS INTO THE CORRESPONDING RECESSES

TEMPORARY PANEL RAILS

BACKGROUND

Printed circuit boards (PCBs) are often produced on large scales (e.g., greater than 100,000 units). Large-scale production of PCBs often requires manufacturing techniques that make use of increased speed and/or automation. PCB panelization is a manufacturing technique in which PCBs are manufactured on a large scale as connected PCBs as a single array (e.g., one panel per PCB), which makes it easier for the PCBs to move through an assembly line. After production, the individual PCBs are depanelized and removed from the array for packaging for installation or further modification.

Panelization requires that excess PCB base material in the form of rails be included on one or more sides of each panel (e.g., of what would be the finished product). The rail enables the PCB to be integrated into the assembly machinery during production and may also protect overhanging or peripheral PCB componentry during the assembly process. However, the rail also increases the overall cost of PCB production as the rail material is discarded after depanelization, which can cost a manufacturer up to 10%-30% of the cost of the PCB. Therefore, there is a need for a system and method to reduce the waste of discarded PCB base material.

SUMMARY

In some aspects, the techniques described herein relate to a system including: a panel including: a printed circuit board (PCB); and a first panel side including a first interlock length configured to interlock with a first rail element including: a projection that interlocks within a corresponding recess of the first rail element, wherein the first interlock length is configured to interlock with the first rail element and be removed from the first rail element without damaging the PCB or the projection In some aspects, the techniques described herein relate to a system, further including a second panel side opposite to the first panel side, the second panel side including a second interlock length configured to interlock with a second rail element, wherein the first rail element and the second rail element are parallel.

In some aspects, the techniques described herein relate to a system, wherein the projection includes a tab.

In some aspects, the techniques described herein relate to a system, wherein the first rail element is formed from non-PCB material.

In some aspects, the techniques described herein relate to a system, wherein the first rail element is configured to engage a conveyor belt.

In some aspects, the techniques described herein relate to a system, wherein the first interlock length can be pressed into the first rail element.

In some aspects, the techniques described herein relate to a system, wherein the first rail element further includes a lip disposed the below the corresponding recess that limits a depth of interlock between the first interlock length and the first rail element, forming a componentry space between the panel and a rail assembly floor.

In some aspects, the techniques described herein relate to a system, wherein the first rail element and the second rail element are joined, forming a cradle that contains the panel.

In some aspects, the techniques described herein relate to a system including: a first rail element configured to secure to a panel including at least one printed circuit board (PCB), the first rail element including: a recess that interlocks a corresponding projection of a first interlock length of a first panel side of at least one PCB, wherein the first interlock length is configured to interlock with the first rail element and be removed from the first rail element without damaging the PCB or the corresponding projection.

In some aspects, the techniques described herein relate to a system including a second rail element configured to interlock with a second interlock length of a second panel side of the panel, wherein the second rail element is parallel to the first rail element.

In some aspects, the techniques described herein relate to a system, wherein the first rail element is configured to engage to a conveyor belt.

In some aspects, the techniques described herein relate to a system, further including the panel.

In some aspects, the techniques described herein relate to a system, wherein the first rail element is formed from non-PCB material.

In some aspects, the techniques described herein relate to a system, wherein the recess includes a socket.

In some aspects, the techniques described herein relate to a system, wherein a panel including: a printed circuit board (PCB); and a first panel side including a first interlock length configured to interlock with a first rail element including: a recess that interlocks within a corresponding projection of the first rail element, wherein the first interlock length is configured to interlock with the first rail element and be removed from the first rail element without damaging the PCB or the projection In some aspects, the techniques described herein relate to a system, wherein the system further includes the first rail element.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
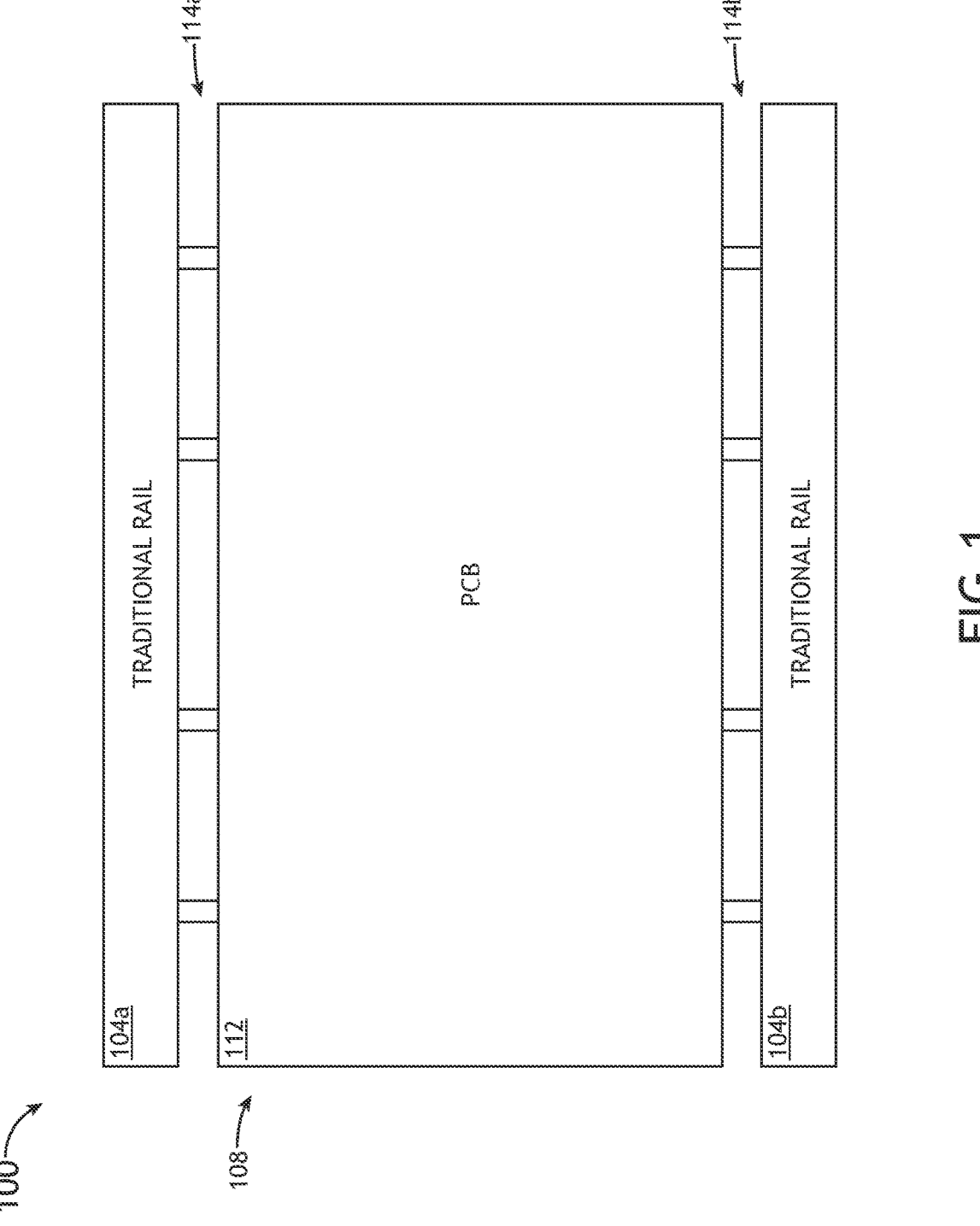
FIG. 1 illustrates a pan view of a traditional panel for PCB manufacturing, in accordance with one or more embodiments of the disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

Broadly embodiments of the concepts disclosed herein are directed to a system and method, which may include a panel used in the assembly or printed circuit boards (PCBs) and a rail element. The panel has at least one side containing an interlock length that is configured to interlock with the rail element as the panel is placed in, or transported through, a PCB conveyor or other PCB device used in PCB manufacturing. The interlock between the interlock length and the rail element comprises projections and corresponding recesses that allow the panel to be pressed into the rail element. The interlock system reduces the amount of PCB material needed for a rail, as the rail element does not include PCB material. The system may include the panel and/or the rail element.

A traditional panel 100 is shown in FIG. 1. The traditional panel 100 includes a traditional rail 104 configured to be placed upon a conveyor belt or guide during the assembly and manufacture of the PCB. The traditional rail 104 is made of PCB material, such as FR4, and does not include any electronic componentry. The traditional panel 100 further includes a PCB area 108 that can be mounted with electronic components, such as a PCB 112. The traditional rail 104*a-b* may be coupled to the PCB area or PCB 112 via tab sets 114*a-b* or via scored/drilled areas that need to be broken (e.g., snapped) to release the PCBs 112 from the traditional panel 104*a-b*.

Figure 2A:
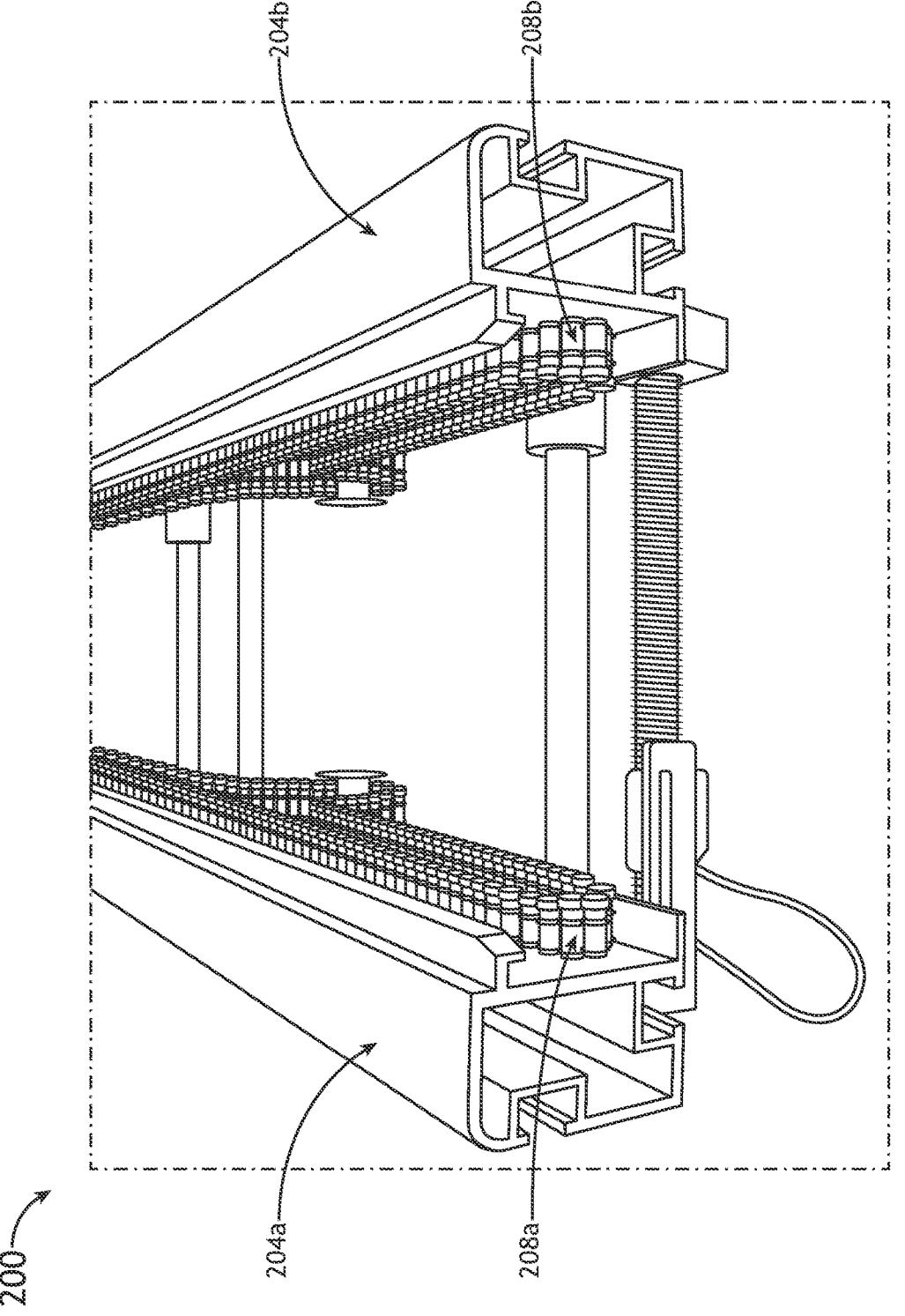
FIG. 2A illustrates a perspective view of a PCB conveyor, in accordance with one or more embodiments of the disclosure.
Figure 2B:
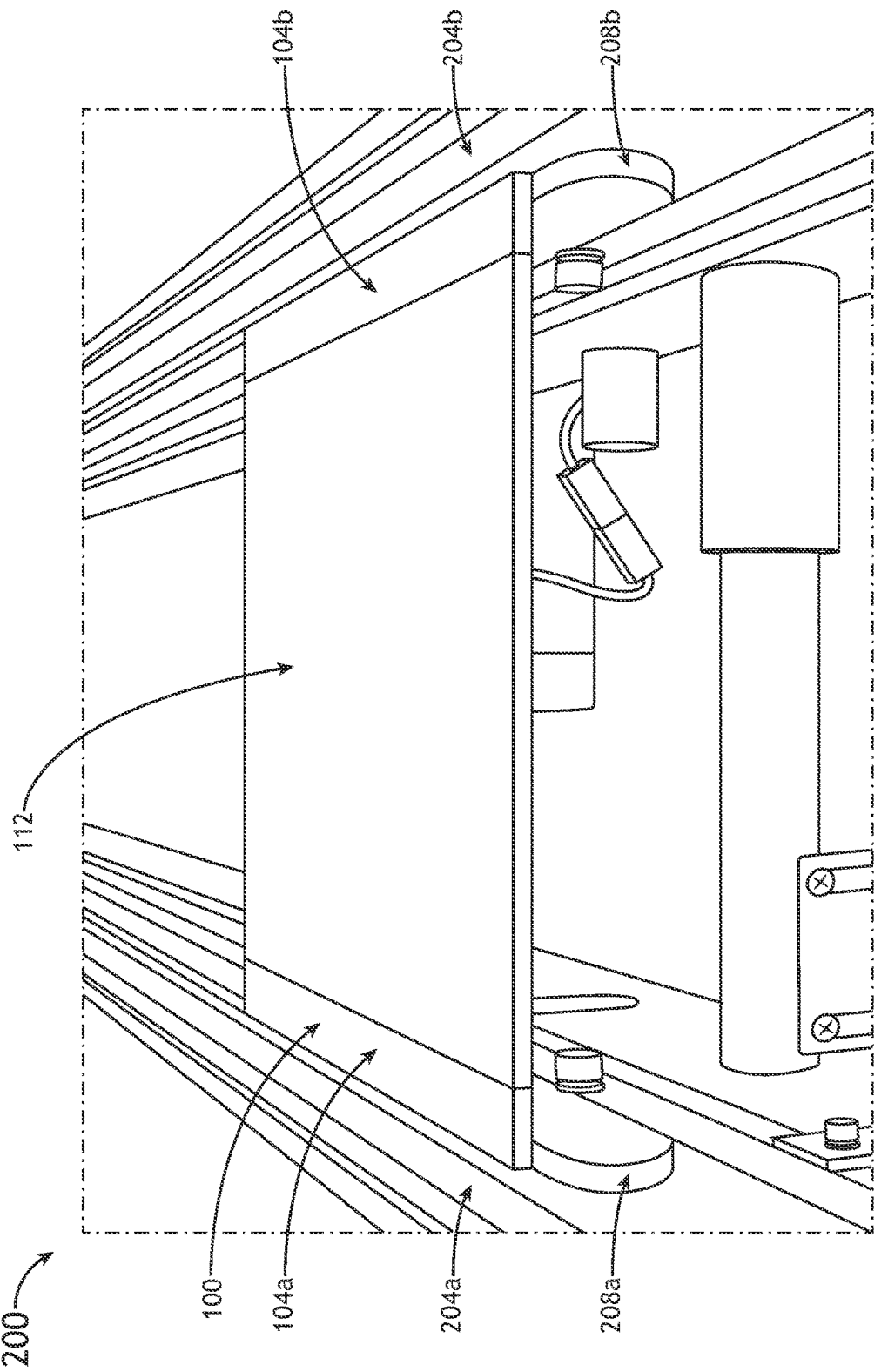
FIG. 2B illustrates a perspective view of a traditional panel placed upon the conveyor belts of a PCB conveyor, in accordance with one or more embodiments of the disclosure.

A PCB conveyor 200 is shown in FIG. 2A. The PCB conveyor 200 includes conveyor walls 204*a-b* that guide the traditional panel 100 along the PCB conveyor 200. The PCB conveyor 200 further includes conveyor belts 208*a-b* or guides that the traditional rail 104 of the traditional panel lays upon, or otherwise engages with, during the PCB assembly process, as shown in FIG. 2B. The traditional panel 100 may include a traditional rail 104 on two sides of the panel (e.g., corresponding to the sides touching the conveyor belts 208*a-b*, or on all four sides of the panel.

Referring now to FIGS. 3 to 8, embodiments of a system 300 according to the concepts disclosed are depicted. The system 300 may be implemented in any electronic or PCB manufacturing scheme, such as an automated PCB assembly system that includes a PCB conveyor 200. In embodiments, the system 300 includes a panel 302 made of a PCB substrate, as shown in FIG. 3A. The PCB substrate may include any type of PCB substrate material including, but not limited to, flame retardant material (e.g., FR1 to FR 6), composite epoxy material (e.g., CEM1 to CEM 5), and glass epoxy laminate (e.g., G10 and G11). For example, the PCB substrate material may include flame retardant four (FR4) material. The PCB material may be formed in any shape including, but not limited to, a rectangle). The panel 302 includes a PCB area 308 for the placement, design, and or assembly of one or more PCBs 312*a-d*. The panel 302 may include one PCB 112 (e.g., a one-up array) or 2, 3, 4, 5, 6, 7, 8, 9, or 10 or more PCBs 112.

Figure 3A:
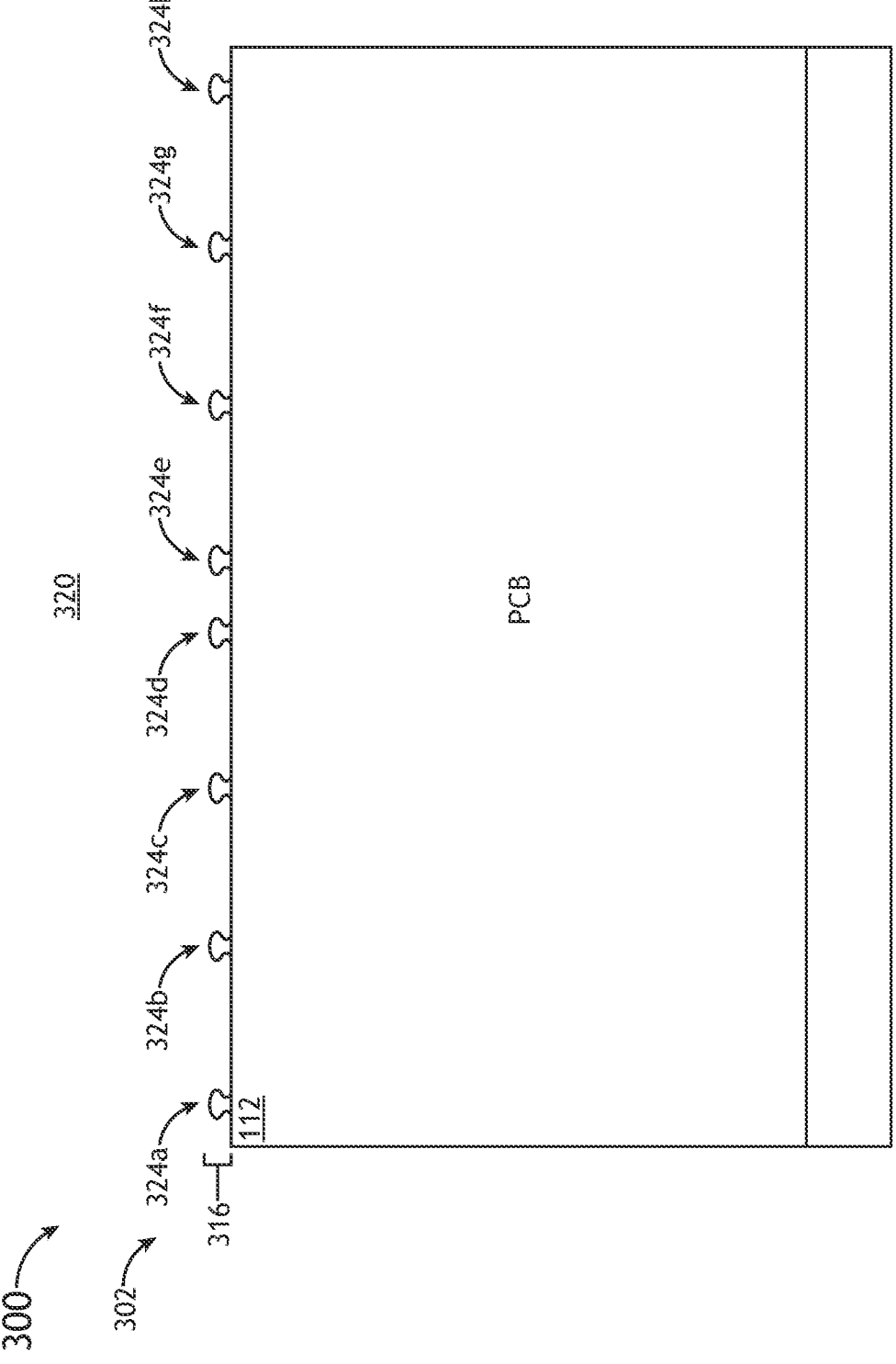
FIG. 3A illustrates a pan view of a panel for PCB manufacturing with a first interlock length containing a series of projections, in accordance with one or more embodiments of the disclosure.
Figure 3B:
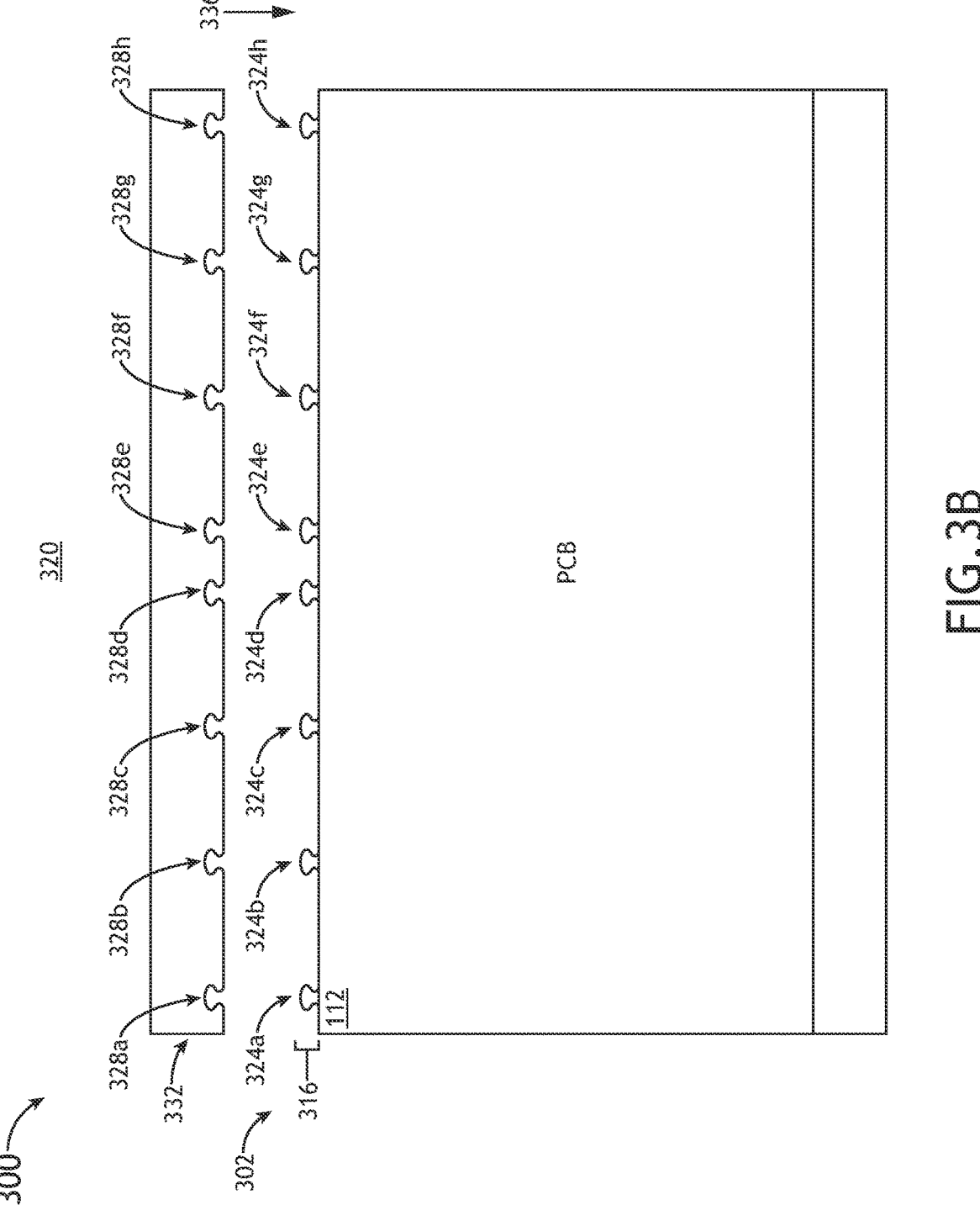
FIG. 3B illustrates a pan view of a panel for PCB manufacturing with a first interlock length containing a series of projections, and a first rail element containing a series of recesses that interlock with the series of projections, in accordance with one or more embodiments of the disclosure.
Figure 3C:
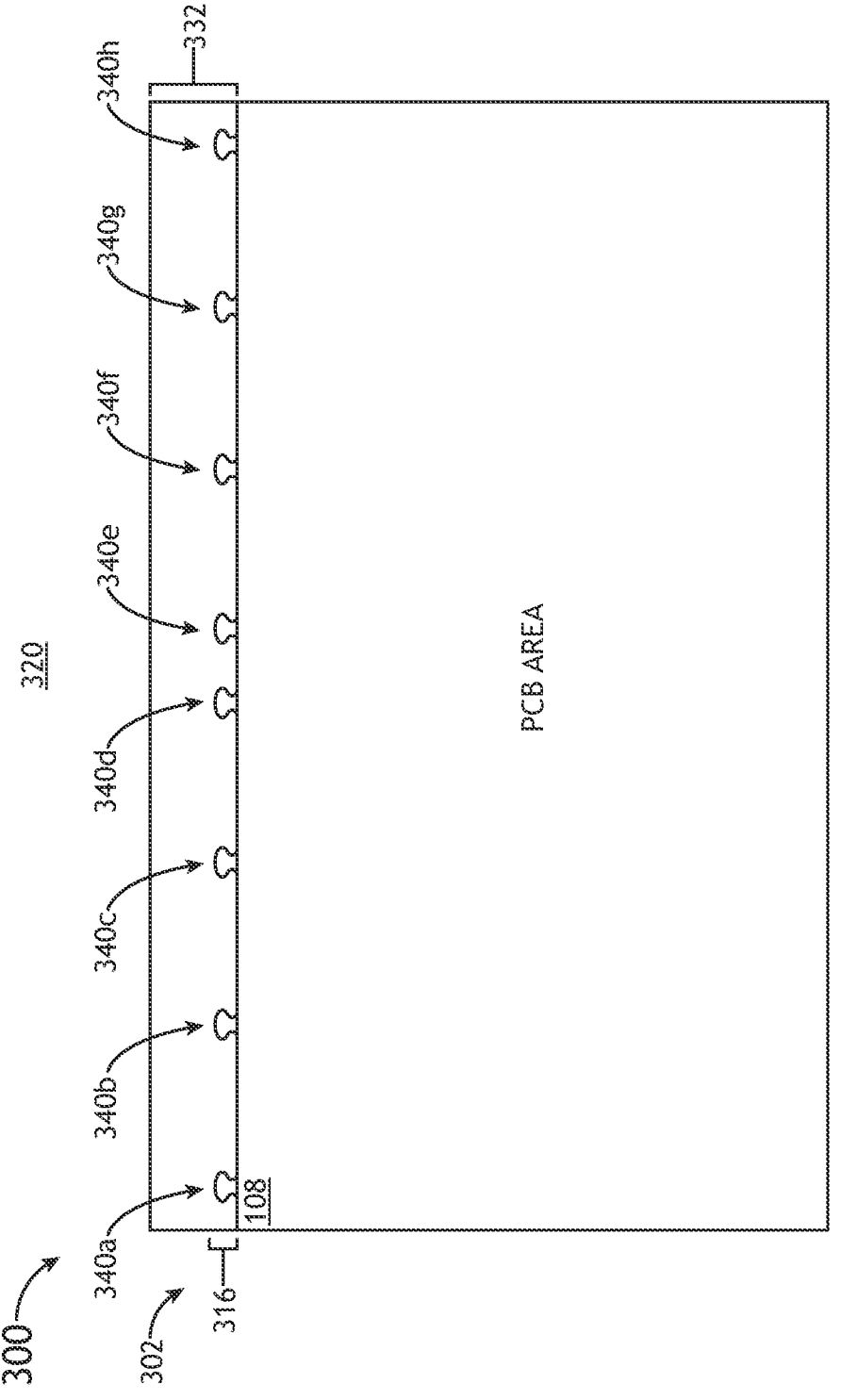
FIG. 3C illustrates a pan view of a panel for PCB manufacturing with a first interlock length containing a series of projections interlocked with a series of recesses of a first rail element, in accordance with one or more embodiments of the disclosure.
Figure 8:
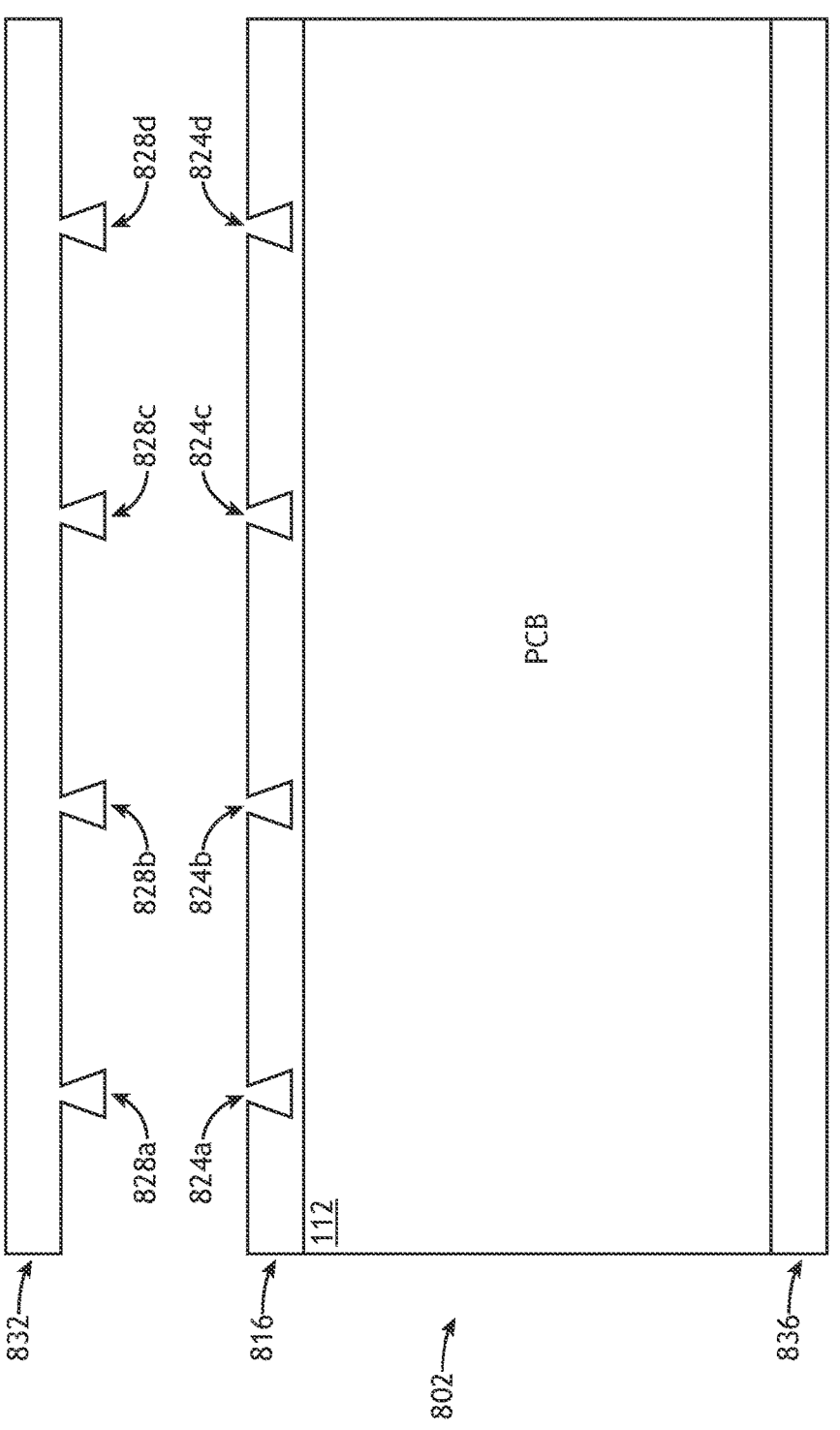
FIG. 8 illustrates a pan view of a panel for PCB manufacturing, the panel having a first interlock length containing a series of recesses that are to interlock with a respective series of projections of a first rail element, in accordance with one or more embodiments of the disclosure FIG. 9 disclosure illustrates a pan view of a panel for PCB manufacturing, the panel interlocking with a first rail element via a set of recesses and projections, with the interlocking forming gaps between the panel and the first rail element, in accordance with one or more embodiments of the disclosure.

In embodiments, the panel 302 includes a first interlock length 316 on a first panel side 320. The first interlock length 316 may include one or more projections 324*a-h* that protrude from the PCB area 108 or one or more PCBs 112 and are positioned in a space typically taken by the traditional rail 104. The one or more projections 324*a-h* are configured to interlock with a first rail element 332 that lies upon or otherwise engages with, the conveyor belts 208*a-b* or guides, as shown in FIG. 3B. The one or more projections 324*a-h* are configured to interlock (via an interlocking action 336 with one or more recesses 328*a-h* of the first rail element 332, resulting in a plurality of interlocks 340*a-f* as shown in FIG. 3C. The first interlock length 316 may include any number of projections 324 per panel 302 including, but not limited to, 2, 3, 4, 5, 6, 7, 8, 9, 10, 20, 30, 40, or 50 or more projections 324 per panel. The first rail element 332 may include any number of recesses including, but not limited to, 2, 3, 4, 5, 6, 7, 8, 9, 10, 20, 30, 40, or 50 or more recesses per first rail element 332. The first interlock length 116 may include one or more recesses 328, and first rail element 332 may include one or more projections 324. The plurality of interlocks 340*a-f* may be equally or unequally distributed along the first side, for example, the plurality of interlocks 340*a-f* may be concentrated near the corners of the panel 302. As noted above, the interlocks may include projections 324 on the first rail element 332 and recesses 328 on the first interlock length. One or more of the plurality of interlocks 340 may be formed via one or more projections on the first rail element 332 interlocking with a respective recess on the panel 302, as shown in FIG. 8 and as described herein.

Figure 4A:
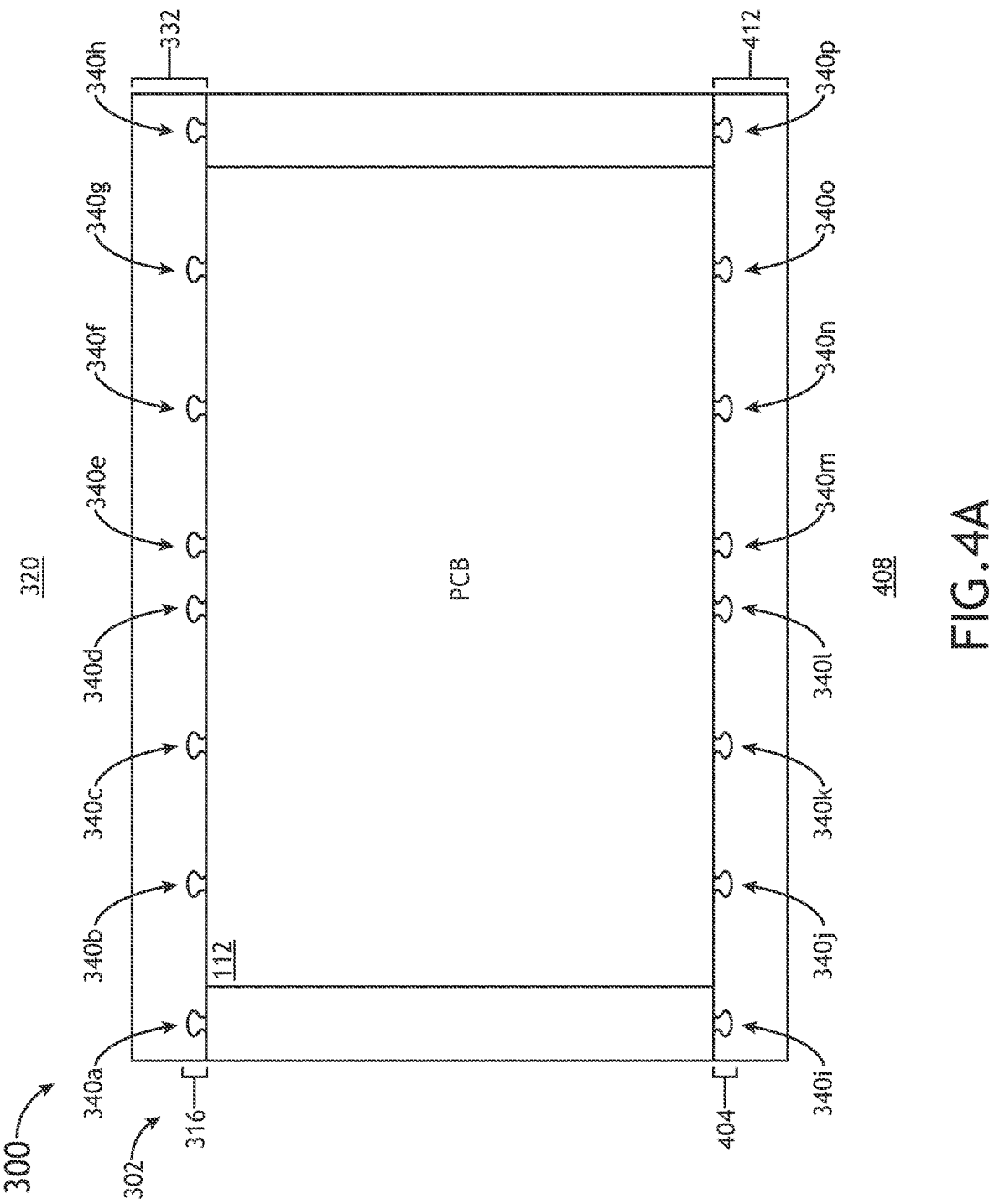
FIG. 4A illustrates a pan view of a panel for PCB manufacturing with a first interlock length containing a series of projections interlocked with a series of recesses of a first rail element, and a second interlock length containing a series of projections interlocked with a series of recesses of a second rail element, in accordance with one or more embodiments of the disclosure.

In embodiments, the panel 302 may include a second interlock length 404 on a second panel side 408 (e.g., the side opposite the first panel side 320) as shown in FIG. 4A.

Figure 4B:
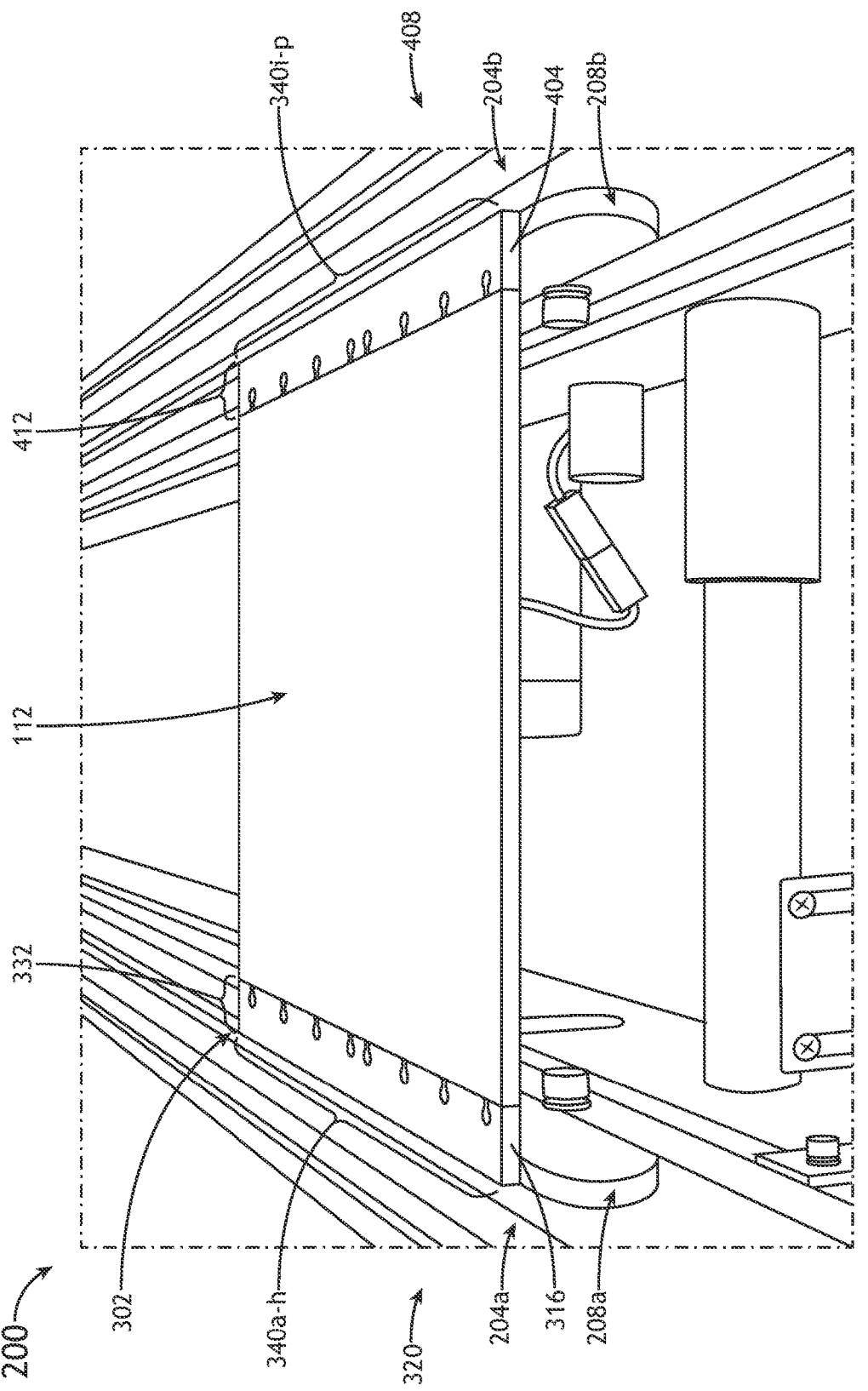
FIG. 4B illustrates a perspective view of a panel for PCB manufacturing placed upon the conveyor belts of a PCB conveyor, the panel having a first interlock length containing a series of projections interlocked with a series of recesses of a first rail element, and a second interlock length containing a series of projections interlocked with a series of recesses of a second rail element, in accordance with one or more embodiments of the disclosure.

The second interlock length 404 may include one or more projections 324 similar to the first interlock length 316 configured to interlock with recesses on a second rail element 412, resulting in a plurality of interlocks 340*i-p* (e.g., the first rail element 332 and the second rail element 412 being parallel). The panel 302 with the first interlock length 316, the first rail element 332, the second interlock length 404, and the second rail element 412 laid upon conveyor belts 208*a-b* are shown in FIG. 4B. For conveyor systems that require a physical connection, such as a connection directly to a conveyor belt or chain, the first rail element 332 and the second rail element 412 may include a coupler that engages with the conveyor belt or chain.

Figure 5:
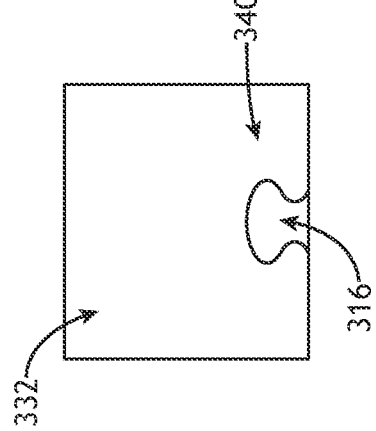
FIG. 5 illustrates the interlocking between a projection 324 and a recess 328, in accordance with one or more embodiments of the disclosure, in accordance with one or more embodiments of the disclosure.
Figure 5:
Figure 5:
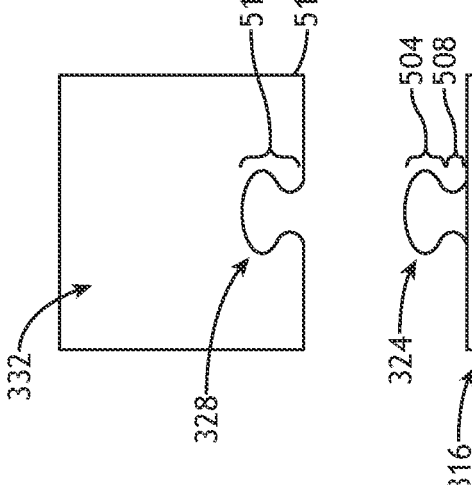

A close-up view of an interlock 304 between a projection 324 and a recess 328 are shown in FIG. 5. The projection 324 may include a tab 504 (e.g., a knob, bump, or key). The projection 324 may also include a stem 508. The recess 328 may include a socket 512 (e.g., a pocket or slot) and a gap 516. The projection 324 and the recess 328 are intended to interlock and interlocking action 336 similar to the interlocking of two pieces of a puzzle. For example, the interlocking action 336 may include manually snapping the projection 324 into the recess 328. The interlocking action 336 may also be made automatically by an alignment and interlocking machine. The interlocking action (e.g., interlocking and removing the interlock 340 can be repeated many times without breaking or snapping the panel (e.g., such as to release the PCBs 112) or otherwise damaging the panel 100, the PCBs 112, or the projections 324.

The tab 504 and stem 508 and the corresponding socket 512 and gap 516 may be of any size or shape. For example, the tab 504 may have a general shape of an oval, as shown in FIG. 5. Other shapes of the tab 504 may include, but not be limited to, a circle, triangle, rectangle, star, mushroom, dovetail, or other polygon. The shape of the tab 504 may also include a custom atypical shape, such as a shape that resembles a logo of a PCB manufacturer.

Figure 6:
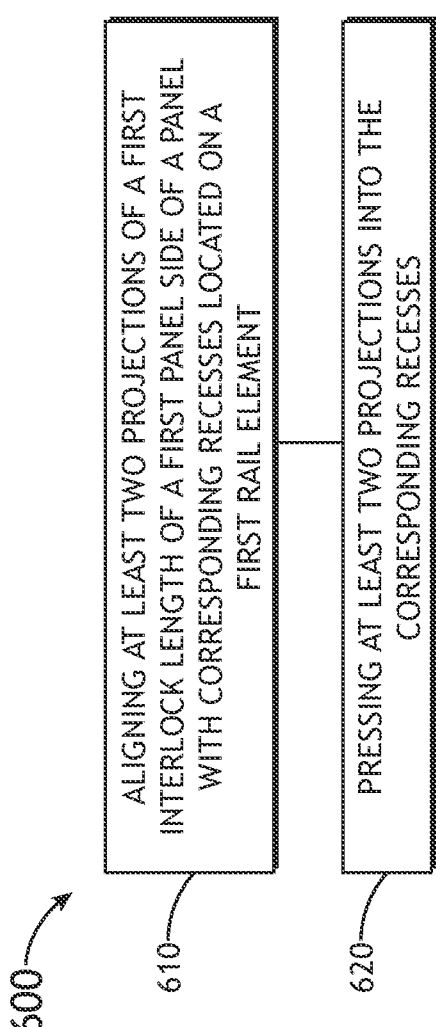
FIG. 6 illustrates a method a method for securing a panel, in accordance with one or more embodiments of the disclosure.

FIG. 6 illustrates a method 600 for securing the panel 302 containing at least one printed circuit boards (PCB) 112 onto a first rail element 332. The method may be performed within any PCB assembly or PCB rework system. In a first step 610, the method 600 includes aligning at least two projections 324 of the first interlock length 316 of the first panel side 320 of the panel 302 with corresponding recesses 328 located on the first rail element 332. The aligning step 610 may be performed visually and manually by an operator or automatically by a machine.

In embodiments, the method 600 includes a step 620 of pressing at least two projections 324 into the corresponding recesses 328. For example, the operator may press the projections 324 into the corresponding recesses 328 manually using fingers or a tool. In another example, the projections 324 may be pressed into the corresponding recesses 328 via a machine. Once interlocked, the projections 324 and the recesses 328 are prevented from being pulled out laterally due to the constriction of the gap 516 preventing the movement of the interlocked tab 504. The projections 324 and the recesses 328 may also be prevented from being released from the interlock 340 due to an interference fit (e.g., friction fit). As noted above, the method 600 may include securing the panel 302 via interlocks that include projections 324 on the first rail element 332 and recesses 328 on the first interlock length.

In embodiments, the method may include a further step of forming the at least two projections 324 and/or forming the two recesses 328 (e.g., before the aligning step 610). Forming the projections 324 and/or the two recesses may include cutting or excising the projections 324 from PCB material or the material of the first rail element 332. Methods for cutting or excising the projections 324 and/or recesses 328 include, but are not limited to, cutting via a CNC router and cutting via a laser (e.g., a laser router).

In embodiments, the first rail element 332 and the second rail element 412 may be created from non-PCB materials. For example, the first rail element 332 and the second rail element 412 may be created from materials including, but not limited to, metal, plastic (e.g., polycarbonate, polypropylene, and polyvinyl), and ceramic materials. These non-PCB materials are often less expensive than PCB materials (e.g., FR4), resulting in cost savings. In some instances, the first rail element 332 and the second rail element 412 are created from PCB materials.

Figure 7A:
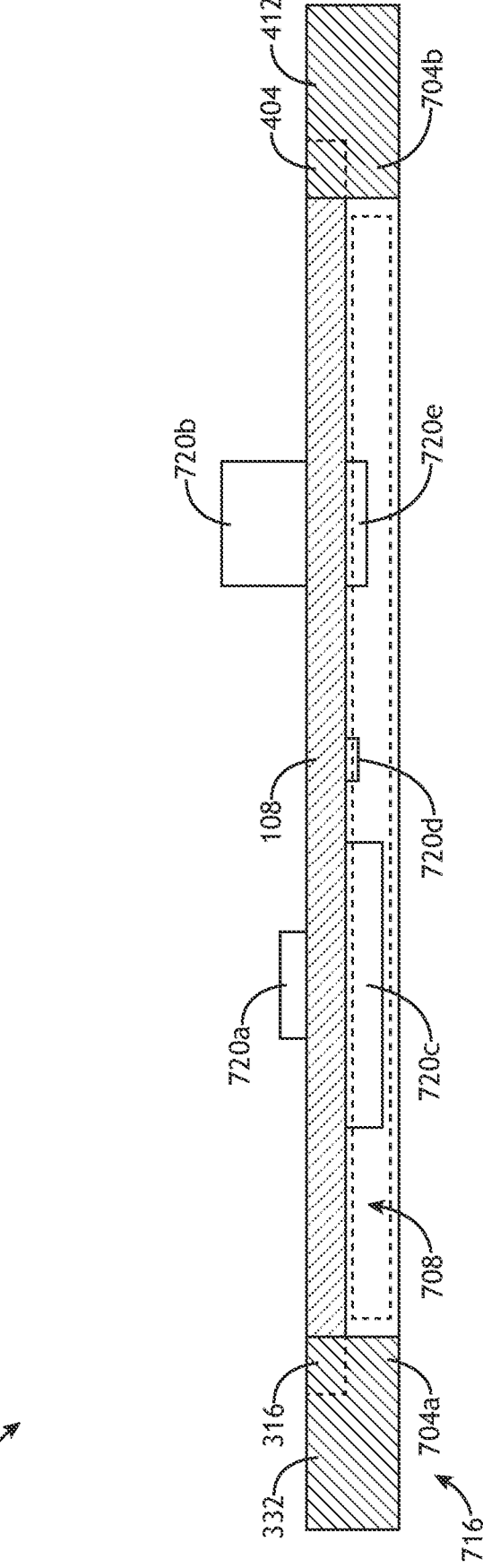
FIG. 7A illustrates a side view of a panel for PCB manufacturing with a first interlock length that is interlocked with a first rail element and a second rail element, in accordance with one or more embodiments of the disclosure.

In embodiments, the first rail element 332 and/or the second rail element 412 includes a lip 704*a-b* disposed below the recesses 328 that limits a depth of interlock between the first interlock length 316 and the second interlock length 404 with the respective first rail element 332 and the second rail element 412, as shown in FIG. 7A. The lip 704*a-b* along with the interlocking of the first interlock length 316 and the second interlock length 404 with the respective first rail element 332 and the second rail element 412, creates a componentry space 708 between the PCB area 108 or PCB 112 and a floor 716 of PCB conveyor 200 that allows clearance for PCB components 720*a-e* (e.g., computer chips, transistors) in the assembly of double-sided PCBs.

Figure 7B:
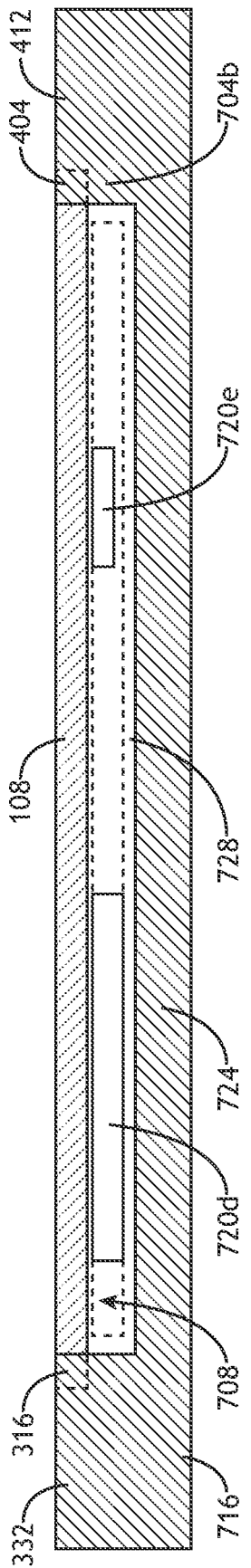
FIG. 7B illustrates a side view of a panel for PCB manufacturing with a first interlock length that is interlocked with a first rail element and a second rail element, with the first rail element and the second rail element forming a cradle, in accordance with one or more embodiments of the disclosure.

In embodiments, the first rail element 332 and the second rail element 412 are combined (e.g., joined) to form a cradle 724, as shown in FIG. 7B. The first rail element 332 and the second rail element 412 may also include the lip 704*a-b* as described above that forms a componentry space 708 between the PCB area 108 or PCB 112 and a cradle floor 728 that provides components for PCB components 720*d-e*.

In some embodiments, a system 800 includes a panel 802 (e.g. that includes one or more PCBs 112) and that includes a first interlock length 816 containing one or more recesses 824*a-d* that interlock with one or more projections 328*a-d* of the first rail element 832. The system 800 may further include a similar interlock system on a second rail element 836. In some embodiments, the second rail element may include a reversed interlocking system similar to the second rail element 412 shown in FIG. 4A.

Figure 9:
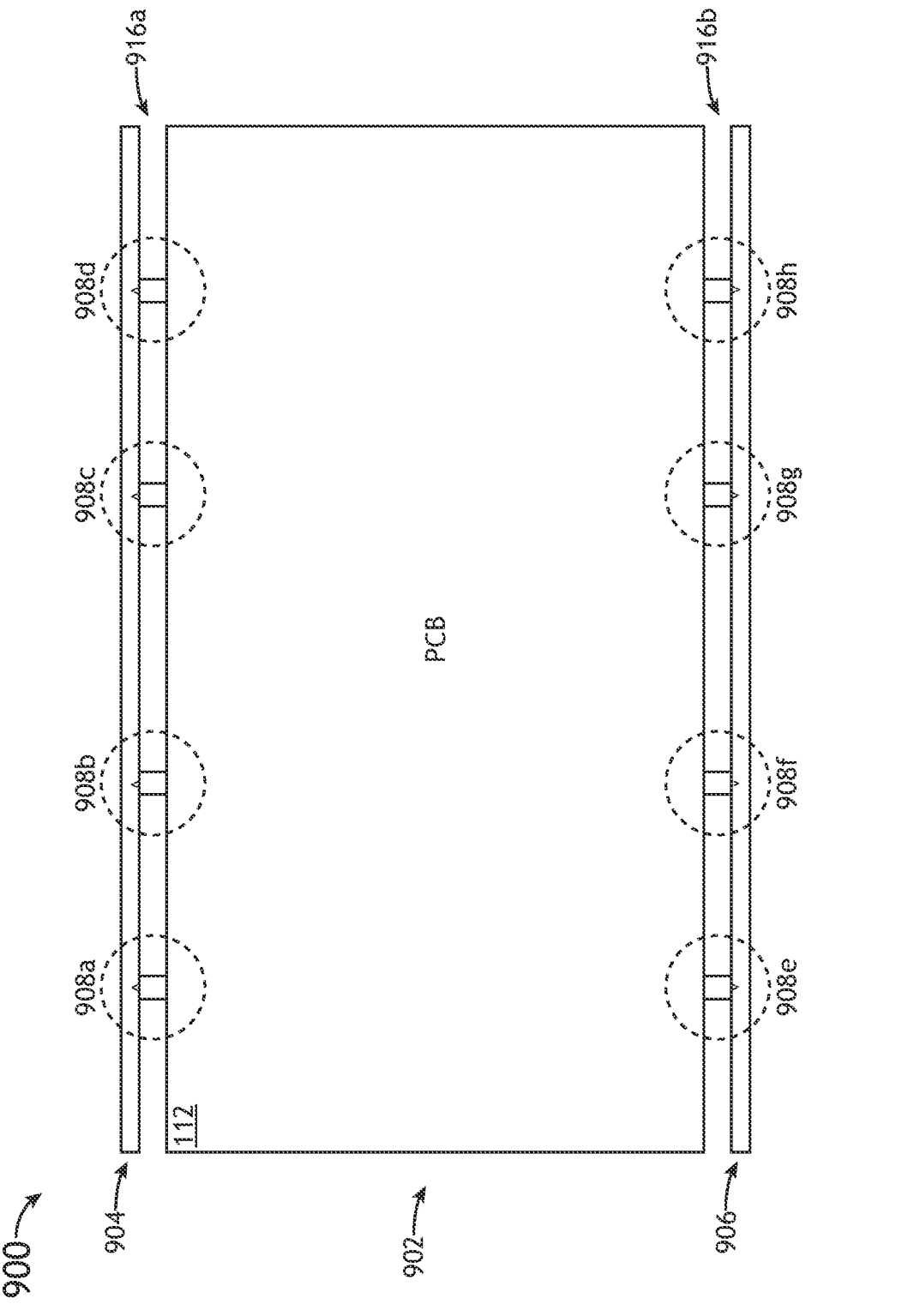

In some embodiments, a system 900 includes a panel 902 (e.g., that includes one or more PCBs 112), a first rail element 904 and, optionally, a second rail element 906. The panel 902 is coupled to the first rail element 904 and/or the second rail element 906 via interlocks 908*a-g*. The interlocks may include: projections upon the panel 902 and recesses on the first rail element 904 and/or the second rail element 906; recesses upon the panel 902 and projections on the first rail element 904 and/or the second rail element 906; or a mixture of both such that there are recesses and projections upon the panel 902 that align with recesses and projections on the first rail element 904 and/or the second rail element 906. The recesses and projections that interact with the panel 902 can be particularly small, as shown in FIG. 9

In some embodiments of the system 300, 800, 900, the interlocking between the panel 302, 806, 908 and the first rail element 332, 832, 904 and the second rail element 412, 836, 906 result in the formation of gaps 916*a-b*. The gaps 916*a-b* occupy space that would traditionally require the use of PCB material to fill in, providing a saving on material costs and material waste.

Figure 10:
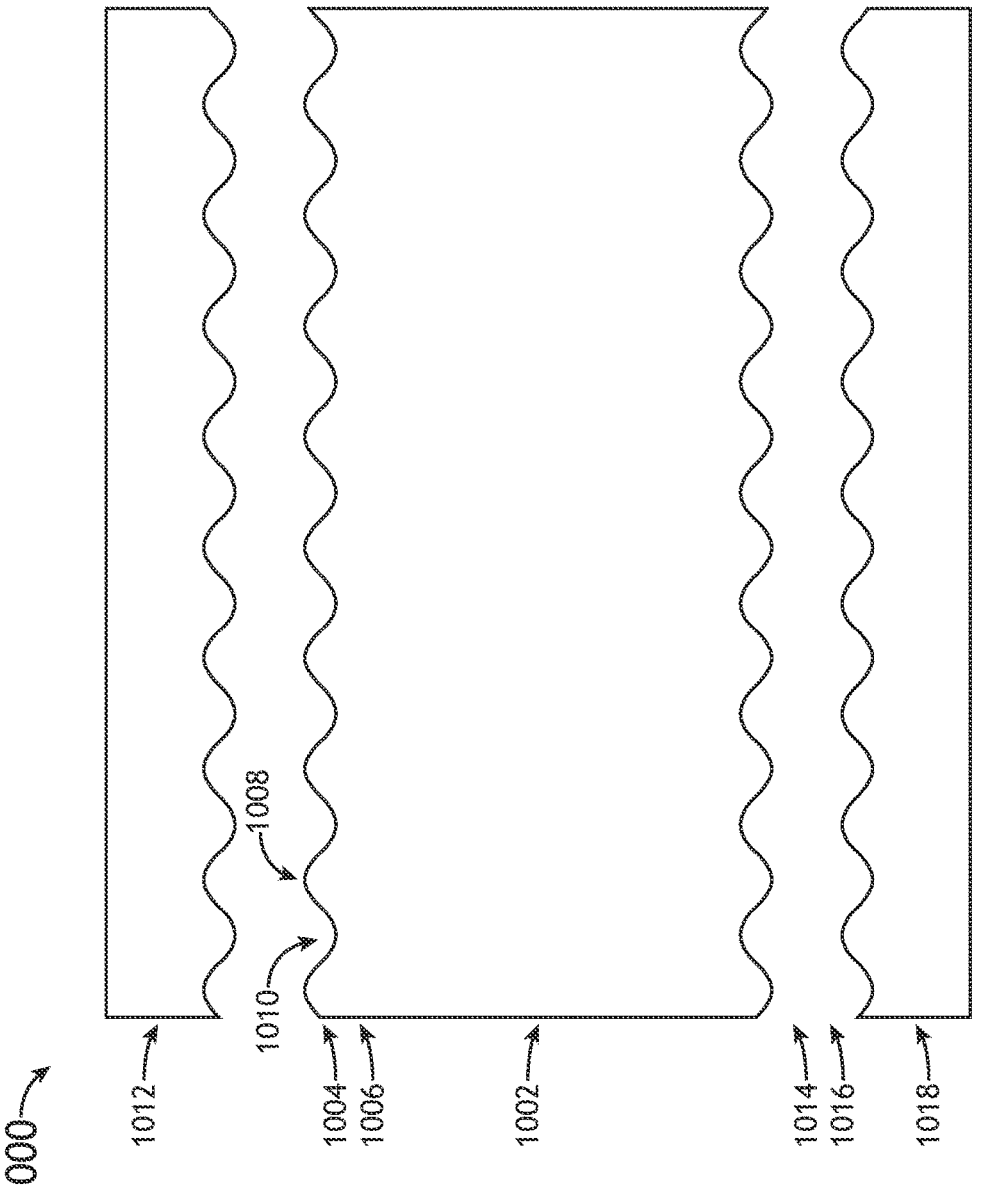
FIG. 10 discloses a pan view of a panel for PCB manufacturing with a first interlock length containing a wavy line that interlocks with a respective first rail element, in accordance with one or more embodiments of the disclosure.

FIG. 10 illustrates a system 1000 where the panel 1002 includes a first panel side 1004 having a first interlock length 1006 composed of a wavy line with crests 1008 and troughs 1010 (e.g., the trough 1010 may be considered as a recess 328, and the crest 1008 may be considered as a projection 324) that interlock with the troughs and crests of the first rail element 1012. The panel 1002 may further include a second panel side 1014 having a second interlock length 1016 comprising a wavy line that interlocks with a second rail element 1018 in a manner similar to the interlocking of the first interlock length 1006 with the first rail element 1012.

Figure 11:
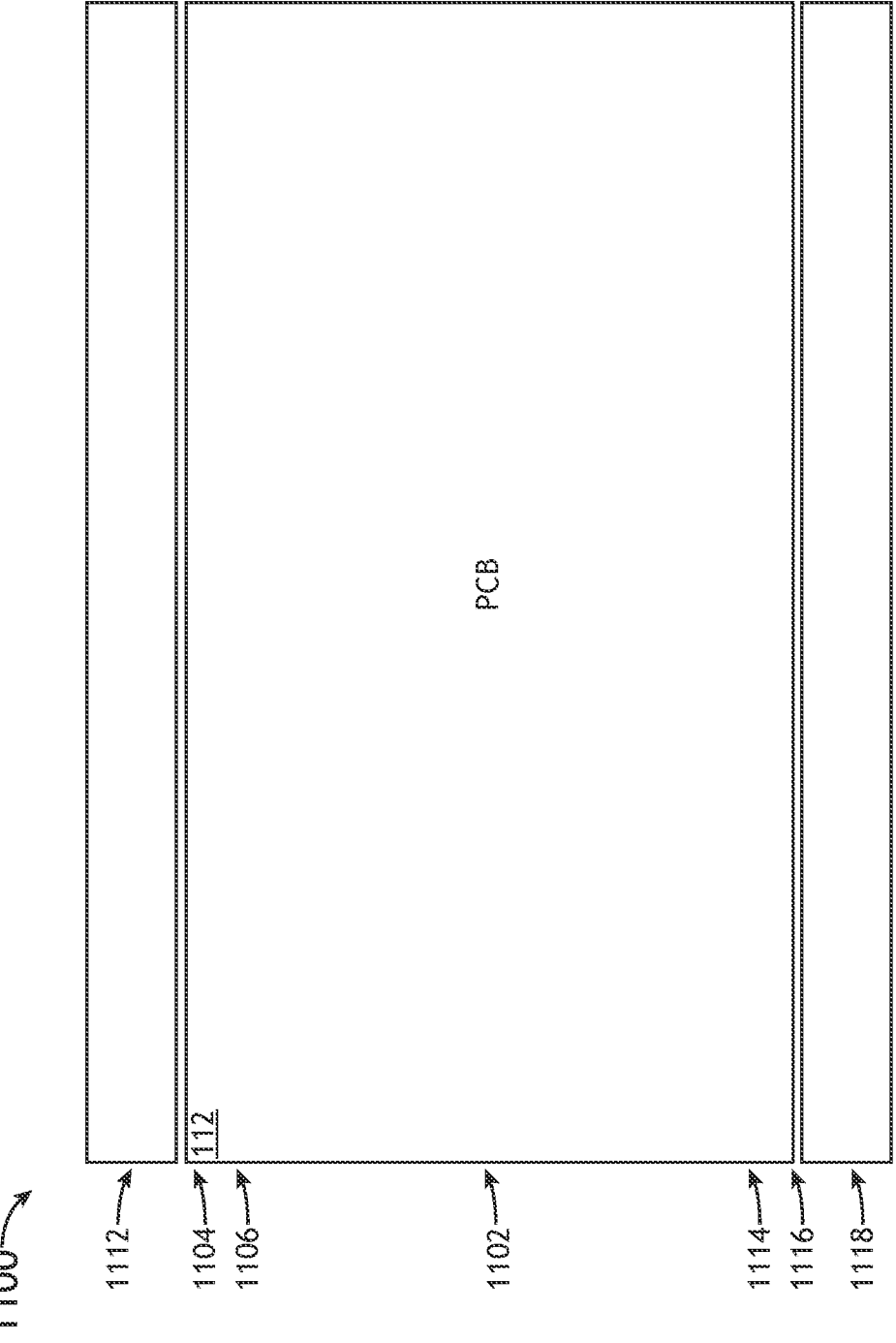
FIG. 11 discloses a pan view of a panel for PCB manufacturing with a first interlock length containing a relatively straight line that interlocks with a respective first element, in accordance with one or more embodiments of the disclosure.

FIG. 11 illustrates a system 1100 where the panel 1102 includes a first panel side 1104 having a first interlock length 1106 composed of a relatively straight line that interlocks first rail element 1112 due to friction between the two elements. The panel 1102 may further include a second panel side 1114 having a second interlock length 1116 comprising a relatively straight line that interlocks with a second rail element 1118 in a manner similar to the interlocking of the first interlock length 1106 with the first rail element 1112.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system comprising:
a panel comprising:
a printed circuit board (PCB); and
a first panel side and a second panel side, each comprising a first interlock length and a second interlock length, respectively, and configured to interlock with a first rail element and a second rail element, respectively, the first panel side and the second panel side comprising:
a plurality of projections that interlock within a corresponding recess of the first rail element and the second rail element, wherein the first interlock length and the second interlock length are configured to interlock with the first rail element and the second rail element respectively, and be removed from the first rail element, and the second rail element without damaging the PCB or the projection; and
the first rail element and the second rail element, each configured to engage a conveyor belt and interlock with the first interlock length and second interlock length, respectively, the first rail element and the second rail element each comprising a lip disposed below the corresponding recess that limits a depth of interlock between the first interlock length and the second interlock length with the first rail element and the second rail element, respectively, whereupon an interlocking between the first interlock length and the second interlock length with the first rail element and the second rail element creates a componentry space below the PCB and that allows clearance for PCB components for an assembly of double sided PCBs.

2. The system of claim 1, wherein the projection includes a tab.

3. The system of claim 1, wherein the first rail element is formed from non-PCB material.

4. The system of claim 1, wherein the first interlock length can be pressed into the first rail element.

5. A system comprising:

a first rail element configured to secure to a panel comprising at least one printed circuit board (PCB), the first rail element comprising:

a recess that interlocks a corresponding projection of a first interlock length of a first panel side of at least one PCB, wherein the first interlock length is configured to interlock with the first rail element and be removed from the first rail element without damaging the PCB or the corresponding projection; and a lip disposed below the recess that limits a depth of interlock between the first interlock length with the first rail element, whereupon an interlocking between the first interlock length with the first rail element and an interlocking between a second rail element and a second panel side of the at least one PCB creates a componentry space below the PCB and that allows clearance for PCB components for an assembly of double-sided PCBs.

6. The system of claim 5, comprising the second rail element, wherein the second rail element is configured to interlock with a second interlock length of a second panel side of the panel, wherein the second rail element is parallel to the first rail element.

7. The system of claim 5, wherein the first rail element is configured to engage to a conveyor belt.

8. The system of claim 5, wherein the first rail element is formed from non-PCB material.

9. The system of claim 5, wherein the recess includes a socket.

10. The system of claim 1, further comprising a cradle floor joining the first rail element and the second rail element, wherein the componentry space is formed between the PCB and the cradle floor.

11. The system of claim 6, further comprising a cradle floor joining the first rail element and the second rail element, wherein the componentry space is formed between the PCB and the cradle floor.

\* \* \* \* \*